Jan. 1, 1974 G. RONZI 3,783,045

PROCESS FOR PRODUCING DISCRETE SEMICONDUCTOR DEVICES OR INTEGRATED CIRCUITS

Filed Nov. 9, 1970 3 Sheets-Sheet 1

Jan. 1, 1974 G. RONZI 3,783,045

PROCESS FOR PRODUCING DISCRETE SEMICONDUCTOR DEVICES OR INTEGRATED CIRCUITS

Filed Nov. 9, 1970 3 Sheets-Sheet 2

Jan. 1, 1974 G. RONZI 3,783,045

PROCESS FOR PRODUCING DISCRETE SEMICONDUCTOR DEVICES OR INTEGRATED CIRCUITS

Filed Nov. 9, 1970 3 Sheets-Sheet 3

United States Patent Office 3,783,045
Patented Jan. 1, 1974

3,783,045
PROCESS FOR PRODUCING DISCRETE SEMICONDUCTOR DEVICES OR INTEGRATED CIRCUITS

Giancarlo Ronzi, P.S. Eusebio 7, Agrate Brianza, Italy

Filed Nov. 9, 1970, Ser. No. 87,922
Claims priority, application Italy, Nov. 7, 1969, 53,937/69
Int. Cl. H01l 3/14, 7/32, 11/14
U.S. Cl. 148—187 15 Claims

ABSTRACT OF THE DISCLOSURE

In a process for preparing semiconductor devices of the MOS type, the improvement wherein the number of maskings, as well as the number of operations to be carried out at high temperatures, is reduced with respect to the known processes, and wherein the oxidizing operations are alternated with depositions of silicon nitride in order to control the thickness of the gate oxidization and to protect the device against external agents. The devices obtained by the improved process are characterized in that they have a layer of silicon nitride over the thick oxide, at the same level of the layer of nitride over the gate.

This invention relates to a process for producing discrete semiconductor devices or integrated circuits of the MOS (metal-oxide-silicon) type, and to the devices obtained by such a process.

It is an object of the invention to provide a process faster and less expensive than the known ones, having moreover a higher yield.

Almost all processes used at present for producing the aforesaid devices require the following succession of operations:

(a) oxidizing a first time a wafer of silicon;
(b) carrying out a first masking (source and drain mask);
(c) predepositing and diffusing a doping means;
(d) oxidizing again the wafer for a very long time at a temperature between 900° C. and 1000° C.;
(e) carrying out a second masking, of gate and contacts, whereby a first opening of the contacts is made over the diffused areas;
(f) oxidizing the gate;
(g) carrying out a third masking, whereby the contacts are again opened over the diffused areas;
(h) depositing aluminum;
(i) carrying out a fourth masking after which the aluminum remains both over the gate and over the contacts;
(l) forming an aluminum-silicon alloy.

These known processes have some disadvantages.

In fact, six of the aforesaid operations have to be carried out at high temperatures in order to give well controlled results: this requires a great number of furnaces even if sometimes two similar operations, requiring the same temperature, are carried out in the same furnace. Moreover, the fact that several operations need a severe checking, makes the proceeding of the whole operation more difficult. Finally, the need of carrying out four maskings lowers the total yield of the process, since every masking involves a certain discarding, so that at the end of the process the total discarding will be quite high.

To obviate these disadvantages a different succession of operations is carried out in the process according to the present invention, as follows:

(a) thermally oxidizing the gate or the control electrode;
(b) depositing a layer of silicon nitride ($Si_3N_4$);
(c) depositing a layer of silicon oxide ($SiO_2$);
(d) depositing a second layer of silicon nitride, identical with the first one;

(e) depositing a second layer of silicon oxide;
(f) masking source and drain (first masking);
(g) attacking the layers of oxide and nitride in correspondence with the source and drain openings;
(h) predepositing and diffusing the doping means;
(i) carrying out a second thermal oxidization;
(j) depositing another layer of nitride and oxide;
(k) masking gate and contacts (second masking);
(l) applying a layer of aluminum;
(m) carrying out the metal masking (third masking);
(n) forming the aluminum-silicon alloy.

As it can be seen, in the process according to the invention the maskings are only three, so that the process is simplified and the quantity of discarding is lower. Moreover the operations to be carried out at high temperature are only three, that is the two thermal oxidizations and the predeposition and diffusion of the doping means, so that less furnaces are to be used.

Further advantages are given by the presence of the layers of silicon nitride which allow the thickness of the gate oxidization to be controlled after the second masking, and act also as a protection against external agents. The devices obtained through the invention are characterized in that nitride is present over the thick oxide, at the some level of the layer of nitride over the gate.

Further characteristics and advantages of the invention will appear from a more detailed description of the process according to the invention, taken in conjunction with the accompanying drawings, in which.

Figure 1:
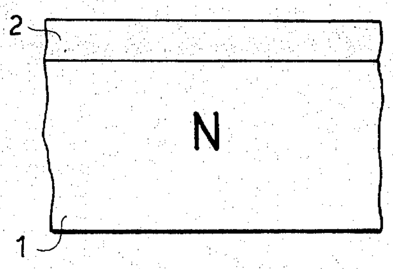
FIG. 1 shows in elevation a silicon wafer after the phase (a) of the process.

FIG. 1 shows the wafer 1 of silicon, which forms a substrate for all operations of the process, covered by a layer 2 of silicon oxide thermally deposited (gate oxide). This layer forms the so-called thin oxide. The indication N relates to the doping means used in the exemplary embodiment which will be disclosed later on.

Figure 2:
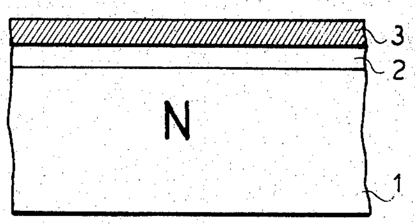
FIG. 2 shows in elevation the wafer after the phase (b)

FIG. 2 shows the wafer of FIG. 1 after a layer 3 of silicon nitride has been deposited over it.

Figure 3:
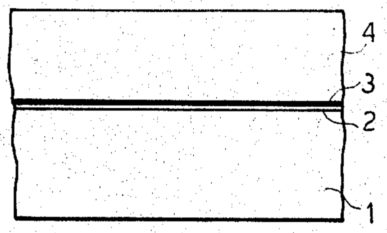
FIG. 3 shows in elevation the wafer after the phase (c)

FIG. 3 shows the wafer of FIG. 2 after the deposition of the layer 4 of silicon oxide (pyrolytically deposited oxide or vapox).

Figure 4:
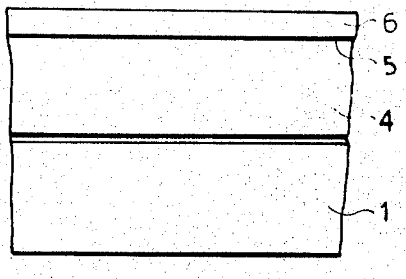
FIG. 4 shows in elevation the wafer after the phases (d), (e)

FIG. 4 shows the wafer of FIG. 3 after a second layer of silicon nitride 5 and of vapox 6 have been deposited.

Figure 5:
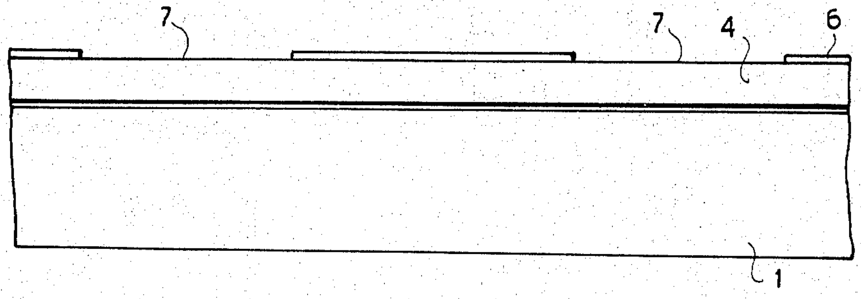
FIG. 5 shows in elevation the wafer after the phase (f)

FIG. 5 shows that the layer of vapox 6 has been partially removed by the first masking, so that the wafer has two regions 7 which show the places wherein the diffusion windows will be located.

The layer 5 of nitride is uncovered in these areas.

Figure 6:
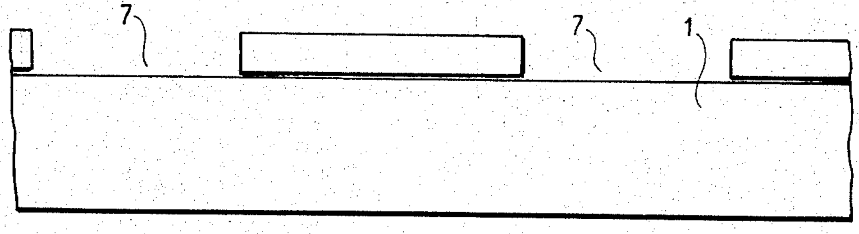
FIG. 6 shows in elevation the wafer after the phase (g)

FIG. 6 shows that also the two layers 5 and 3 of nitride, the layer 4 of vapox and the layer 2 of thermal oxide have been removed in correspondence with the hollows 7; in these areas the wafer of silicon 1 is uncovered.

Figure 7:
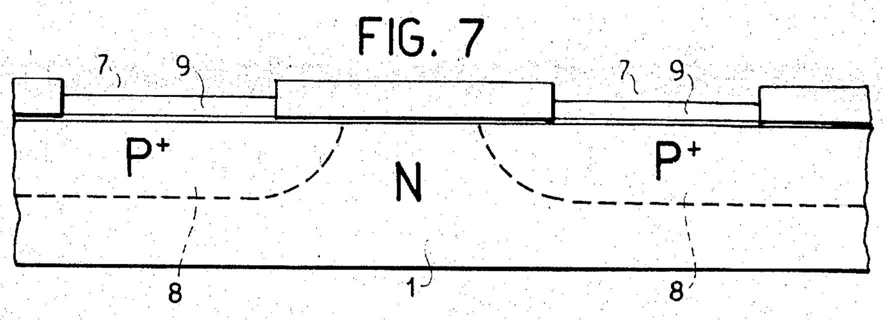
FIG. 7 shows in elevation the wafer after the phases (h), (i)

FIG. 7 shows the two areas 8 in the wafer 1 wherein the doping means diffused: Moreover, in the hollow region 7, a layer of thermal oxide 9 (and 9a) is grown over the wafer during the diffusion process.

Figure 8:
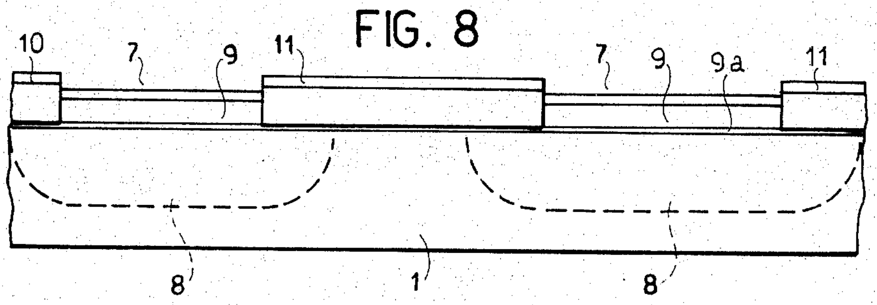
FIG. 8 shows in elevation the wafer after the phase (j)

FIG. 8 shows two more layers 10, 11, the first of nitride and the second of vapox, deposited over the doped and oxidized wafer of FIG. 7.

Figure 9:
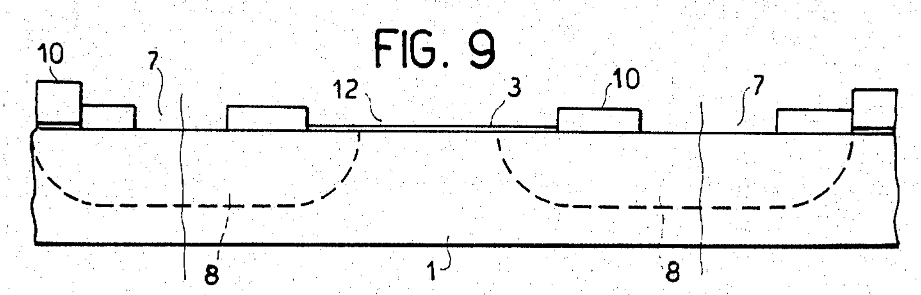
FIG. 9 shows in elevation the wafer after the phase (k)

FIG. 9 shows the wafer after the second masking. One part of the hollows 7 has been filled by the layer of thermal oxide 9 and by the layer of nitride 10, while the other part shows the areas 8 wherein the doping means diffused has been brought to light. The figure shows also that the layer 11 of vapox has been removed, so that the layer 10 of nitride is uncovered. Moreover, the central projection left on the wafer by the preceding operations has been almost wholly removed, by forming a hollow 12 defined by the layers 9 and 10, and reaching the layer 3 of nitride.

Figure 10:
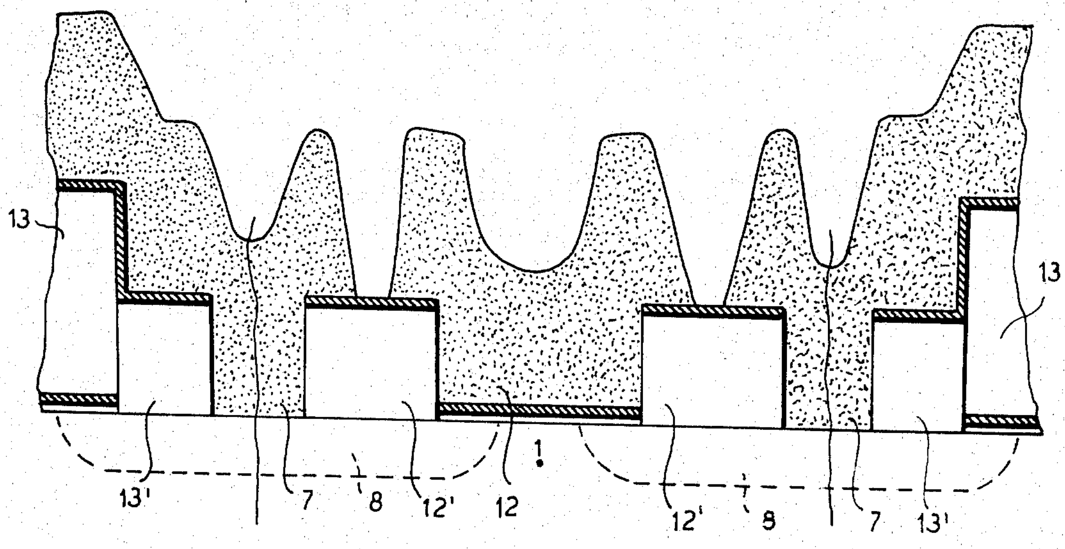
FIG. 10 is a sectional elevational view of a finished product.

FIG. 10 is a sectional view of a device obtained by the process according to the invention. Two projections 13 and 13', the hollow 7 and another projection 12', symmetrically placed at the right and at the left of the hollow 12, are shown in the figure. The projection 13 is formed by all layers of oxide and nitride up to the layer of nitride 10; the projection 13', as already said, is formed by the layers 9 and 10 of thermal oxide and respectively of nitride. Within the projections 13 the layers 2 to 6 end in correspondence with places where the hollows 7 had previously been made. The projections 12' defining the central hollow 12 have the same structure as the projections 13'. The whole device is covered with aluminum, except over two small areas, one for each projection 12', where the silicon nitride is uncovered.

Figure 11:
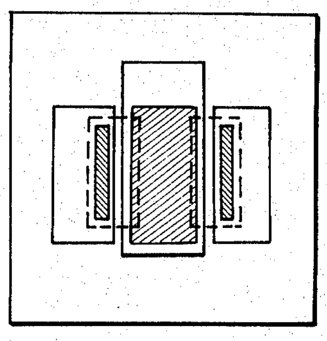
FIG. 11 is a plan view partially in section of the same product.

FIG. 11 is a plan view of the finished device. In the center thereof the broadly hatched area can be seen where the gate oxide is present; the two diffused areas are shown by the sides of this area. Between the diffused areas and the gate area there are the contacts, which are interchangeable.

The following operations are carried out to realize the finished device shown in FIGS. 10 and 11: The first step of the process consists in the gate oxidization. To this end the wafer of silicon 1 is treated for some time first in $O_2$ atmosphere and the in $N_2$ atmosphere at a temperature of about 1100° C.; the layer of oxide 2 is obtained, whose thickness is of about 850 A. (see FIG. 1). After this first step a layer 3 of silicon nitride ($Si_3N_4$) having a thickness from 1000 to 2000 A. is deposited over the gate oxide 2. By such an operation a controlled thickness of oxide is surely present over the gate also after the following steps.

According to a preferred embodiment the aforesaid operation is carried out in epitaxial reactors by causing silane ($SiH_4$) to react with ammonia at a temperature of about 800–1000° C. According to another embodiment the layer of nitride may be deposited by causing silicon tetrachloride ($SiCl_4$) to react with ammonia still at a temperature of about 800–1000° C.

Silicon oxide is deposited over the nitride until a layer 4 of oxide is obtained whose thickness is within the range of 1–2 microns.

To this end silane, mixed with nitrogen or argon in a percentage from 3% to 20%, is caused to react with oxygen. The temperature of this process is lower than the one at which the first oxidization occurs, being of about 300–600° C. The oxide can be deposited also by pyrolytical decomposition of an alkylsilane at a temperature of about 750° C.

The great thickness of the layer 4 of vapox could give rise to breakdowns if the deposition is carried out by a single operation. Therefore it may be suitable to deposit the oxide in two stages spaced by a sintering stage.

Then a second layer of silicon nitride 5 and of vapox 6 are deposited by the same methods previously used. The layer of nitride is identical with the first one in thickness, whereas the layer of oxide has a reduced thickness, of about ½ micron. The layer 6 of oxide serves to mask the underlying nitride 5 (see FIG. 4).

The device begins to take form by the first masking, carried out by the usual photomasking methods. By such an operation the layer 5 of nitride is brought to light in correspondence with the position 7 where the diffusion windows, i.e. the source and the drain, will be realized (see FIG. 5). The layer 5 of nitride, the layer 4 of vapox, the layer 3 of nitride and the layer 2 of oxide are sequentially attacked in correspondence with the openings 7. The first layer of nitride is attacked by hot phosphoric acid (at 150° C.); the underlying layer 4 of vapox is on the contrary attacked by a solution comprising hydrofluoric acid at room temperature. Generally the HF solution is buffered so that the attack rate is constant. The same operations are repeated for the layer 3 of nitride and the layer 2 of thermal oxide. FIG. 6 shows the wafer after these operations: as it can be seen, silicon has been brought to light in correspondence with the openings 7 of the contacts.

Then the predeposition and the diffusion of the doping means are carried out. Said doping means will be a donor if a device having channels of N type is desired; it will be on the contrary an acceptor if devices with channels of P type are desired. In the first case phosphorus could be used as a donor, whereas boron could be an acceptor. According to a preferred embodiment, to obtain channels of N type, the substratum is a wafer of silicon of P type, and the donor employed could be $POCl_3$, which is diffused at a temperature of 900–1100° C., whereas in the other case the substratum is silicon of N type and the acceptor could be $BBr_3$, which is diffused at a temperature of 1000–1100° C. Said diffusion can occur first in inert atmosphere, then in oxidizing atmosphere, then again in inert atmosphere. FIG. 7 relates to this second case.

After the doping means has diffused, a second thermal oxidization is carried out: this occurs at a temperature of 900–1000° C., and, as a result, a second layer of silicon oxide 9, having a thickness of about 1 micron, is added (see FIG. 7).

Before the second photomasking a layer of nitride about 1 micron thick, and a layer of oxide about ½ micron thick are still deposited.

Because of the second masking (gate and contacts masking) the silicon nitride 3 and the doped silicon are brought to light in correspondence with the gate and respectively with the hollows 7 of the contacts, while also the layer 11 of oxide is removed. Then a layer of aluminum, having a thickness of 1–2 microns, is deposited on the so treated wafer. This layer of aluminum will be removed by the third masking (metal masking) from the areas where it is not required. The last operation leads to the formation of the aluminum-silicon alloy, at a temperature of 500–550° C. In this step a real interpenetration of aluminum and silicon occurs, while between metal and oxide there is a soldering limited to some spots.

The devices obtained by the process according to the invention are characterized in that nitride is present over the thick oxide, at the same level of the nitride over the gate.

The washings to be carried out before many operations have not been mentioned in this description: these washings, in the disclosed process, are greatly simplified with respect to the known processes and essentially consist in mere immersions in diluted hydrofluoric acid.

I claim:

1. A process for preparing semiconductor devices and integrated circuits of the MOS type, which comprises:

(a) thermally oxidizing the gate on a silicon wafer;

(b) depositing a first layer of silicon nitride on the gate oxide;

(c) depositing a first layer of silicon oxide over the silicon nitride layer;

(d) depositing another layer of silicon nitride over the first layer of silicon oxide;

(e) depositing another layer of silicon oxide over the second layer of silicon nitride;

(f) masking the diffusion windows;

(g) chemically attacking the layers of silicon oxide and silicon nitride in correspondence with the openings of the diffusion windows;

(h) predepositing and diffusing a doping means on the silicon wafer;

(i) carrying out a second thermal oxidization;

(j) depositing a third layer of silicon nitride and a third layer of silicon oxide on the wafer;

(k) masking the gate and the contacts;

(l) applying aluminum over the entire device except for two areas covered by the silicon nitride;

(m) carrying out the masking of the aluminum;

(n) forming the aluminum-silicon alloy.

2. A process accordinng to claim 1, characterized in that the deposition of the layers of silicon nitride is obtained by causing silane to react with ammonia in epitaxial reactors.

3. A process according to claim 1, characterized in that the deposition of the layers of silicon nitride is carried out by causing silicon tetrachloride to react with ammonia.

4. A process according to claim 2, characterized in that said reaction occurs at a temperature of about 800–1000° C.

5. A process according to claim 1, characterized in that the deposition of the silicon oxide is carried out by causing silane, mixed with nitrogen or argon in a percentage from 3 to 20%, to react with oxygen, at a temperature of 300–600° C.

6. A process according to claim 1, characterized in that the deposition of the first layer of silicon oxide is carried out in two steps spaced by an annealing.

7. A process according to claim 1, characterized in that the chemical attack of the layers of silicon nitride is made by hot phosphoric acid.

8. A process according to claim 7, characterized in that the temperature of phosphoric acid is of about 150° C.

9. A process according to claim 1, characterized in that the chemical attack of the layers of silicon oxide is made by cold hydrofluoric acid, or by a solution of said acid.

10. A process according to claim 1, characterized in that the wafer of silicon is of N type and the doping means is an acceptor.

11. A process according to claim 1, characterized in that the acceptor is $BBr_3$ which is diffused at a temperature of about 1000–1100° C.

12. A process according to claim 1, characterized in that the wafer of silicon is of P type, and the doping means is a donor.

13. A process according to claim 12, characterized in that the donor is $POCl_3$ which is diffused at a temperature of about 900–1100° C.

14. A process according to claim 3 characterized in that said reaction occurs at a temperature of about 800–1000°C.

15. A semiconductor device produced by the process of claim 1 characterized by a silicon nitride layer over a thick oxide layer at the same level of the nitride layer over the gate.

References Cited

UNITED STATES PATENTS

| | | | |
|---|---|---|---|
| 3,432,920 | 3/1969 | Rosenweig | 148—187 |
| 3,541,676 | 11/1970 | Brown | 29—571 |
| 3,583,857 | 6/1971 | Meer et al. | 148—187 |
| 3,592,707 | 7/1971 | Jaccodine | 148—187 |

ROBERT D. EDMONDS, Primary Examiner

U.S. Cl. X.R.

29—571; 317—240